SANDWICHED CONSTRUCTION FOR A TUNNEL DIODE

Filed June 10, 1965

INVENTORS:
DONALD H. KORTKAMP,
JAMES M. SMITH,

BY Robert J. Mooney
THEIR ATTORNEY.

United States Patent Office 3,354,361
Patented Nov. 21, 1967

3,354,361
SANDWICHED CONSTRUCTION FOR A TUNNEL DIODE

Donald H. Kortkamp and James M. Smith, Liverpool, N.Y., assignors to General Electric Company, a corporation of New York Filed June 10, 1965, Ser. No. 462,947
4 Claims. (Cl. 317—234)

This invention relates generally to a tunnel diode construction and, more specifically, to a tunnel diode formed by sandwiching a strip of germanium between glass side pieces.

In modern technology there are increasing uses for tunnel diodes with high power capability at high frequencies. It is desirable to achieve the higher power at high frequencies without losing mechanical stability of the device. Also, in connection with the modern trend toward miniaturization of increasing numbers of circuits, it is preferable to keep the tunnel diode package as small as possible. Prior art attempts to provide tunnel diodes having these characteristics have primarily revolved about planar techniques. Further, all of these planar proposals have involved the use of thin oxide layers over a semiconductor substrate, which produces an undesirably high package capacitance.

In a tunnel diode the self-resonant frequency is given by the expression:

$$f_{x0}=\frac{1}{2\pi C}\sqrt{\frac{C}{L}-\left(\frac{1}{R}\right)^2}$$

where C is the capacitance of the tunnel diode, L is the series inductance of the tunnel diode and R is the small signal resistance of tunnel diode junction at the bias point. From this expression it may be seen that to obtain high frequencies, such as in the X-band region, it would be desirable to have C as small as possible and R as large as possible. However, if large powers (large currents) are desired, R will have to be decreased. If both R and C could be controlled independently, this problem would not be so significant. But the fact is that both R and C are dependent upon the junction characteristics and have an inverse relationship. Due to this inverse relationship, when the quantity R is reduced to obtain high powers, the quantity C is increased, resulting in a lowering of the self-resonant frequency, and thereby the operating frequency.

This leaves only the series inductance L to be adjusted to provide a high frequency of operation at high powers. The series inductance may be expressed approximately as:

$$L=kh$$

where $k$ is a constant and $h$ is the length of the current path through the tunnel diode package. However, in prior art tunnel diodes, if the distance $h$ is decreased, the contact plates are placed in closer proximity and the package capacitance increases, thereby producing the opposite effect from that desired. Also, decreasing the factor $h$, in prior art devices, is extremely difficult, if not impossible.

Therefore, it is a primary object of this invention to provide an improved tunnel diode having reduced series inductance.

Another object of this invention is to provide a tunnel diode having a sufficiently reduced series inductance to facilitate attainment of a high power capability at high frequencies of the order of 5 gigacycles per second.

Another object of this invention is to provide an improved tunnel diode of the foregoing character having low series resistance and low package capacitance.

Yet another object of this invention is to provide a tunnel diode which has a very small size and yet is mechanically strong.

Briefly, in one form thereof, this invention relates to the formation of a tunnel diode by sandwiching a wafer of P-type germanium between two glass wafers. The germanium is then bonded to the glass wafers to form a composite wafer which is sliced into blocks. Each of the blocks comprises a slice of germanium sandwiched between two glass side pieces. A plurality of narrow strips, of an alloy material doped with an impurity of the N-type, are then placed transversely across said slice of germanium so that the strips extend from one glass side piece to the other glass side piece. Each strip of alloy material is then alloyed with the germanium to form a tunnel diode junction.

The novel and distinctive features of this invention are set forth in the appended claims. The invention, together with further objects and advantages thereof, may be better understood by reference to the following description and accompanying drawings in which:

Figures 1, 2, 3, 4:
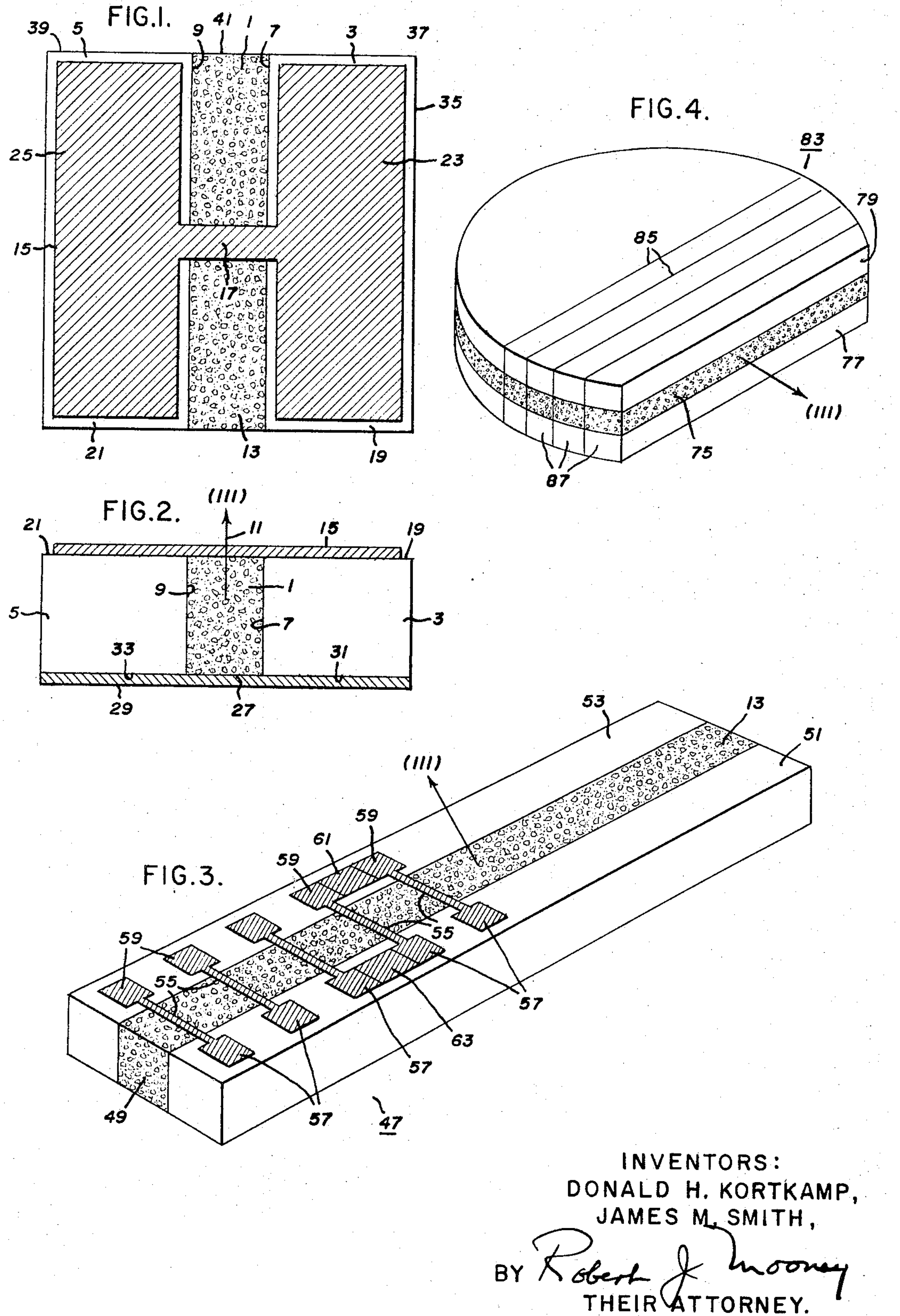
FIGURE 1 is a top view of one embodiment of the tunnel diode of this invention.
FIGURE 2 is an end view of the embodiment illustrated in FIGURE 1.
FIGURE 3 is a perspective view of a plurality of tunnel diode junctions formed according to the embodiment illustrated in FIGURE 1.
FIGURE 4 illustrates the basic structure involved in forming the tunnel diodes of this invention.

Referring now to FIGURES 1 and 2, the basic tunnel diode of this invention may be seen. A slice of germanium 1, which may be doped with an impurity of either type, but which will hereinafter be referred to as P-type, is shown between two glass side pieces 3 and 5. The germanium is bonded to glass side piece 3 at joint 7 and to glass side piece 5 at joint 9. The method of bonding germanium slice 1 to glass side pieces 3 and 5 is the same as that described in copending application Ser. No. 180,164, filed Mar. 16, 1962, and assigned to the same assignee as is this application. As illustrated by arrow 11 in FIGURE 2, the germanium slice 1 may preferably be placed so that side 13 of the slice is parallel to the <111> plane of the germanium. After the slice 1 is placed in position and bonded to the glass side pieces 3 and 5, its face 13 is polished to give a clean, smooth surface to which it is possible to alloy.

An alloy material 15 is doped with an impurity of the type opposite to that of the germanium, and for purposes of this discussion it will be classed as N-type. A narrow strip 17 of alloy material 15 is placed across the side 13 of the slice of germanium 1. The narrow strip 17 extends from a face 19 of glass side piece 3 to the face 21 of glass side piece 5. At each end of strip 17 larger areas of alloy material 15 are affixed to the glass side pieces 3 and 5 to provide electrical contact areas. The alloy material in the strip 17 may then be alloyed into the germanium slice 1 to form a tunnel diode junction at the side 13. Of course, it should be realized that there need only be one contact area, and that the contact areas 23 and 25 need not be formed from the alloy material 15 but may be formed from any suitable conducting material.

In FIGURE 2 the end view of this embodiment of the tunnel diode constituting the invention of this application illustrates that the side 27 of the slice of germanium 1 which is parallel to the side 13 is provided with a metallized contact 29. The metallized contact 29 also covers face 31 of glass side piece 3 and face 33 of glass side piece 5. Metallized contact 29 and contact areas 23 and 25 provide a means for connecting the tunnel diode in an electrical circuit.

Typical dimensions of the device shown in FIGURE 1 may involve a 20 milliinch square, as shown in the top view. This means that the side 35 of the device will be 20 mils long and that the widths 37 and 39 of glass end pieces 3 and 5 will be 8 mils, with the width 41 of the slice of the side 13 will be 4 mils. The thickness of the slice of germanium 1, from side 13 to side 27 in FIGURE 2, is the critical figure as far as the series inductance is concerned and may typically be on the order of 6 mils. This figure represents a significant reduction over the previous typical of 26 mils and minimum of about 16 mils, especially in view of the fact that this figure may be further reduced by as much as 3 mils in some arrangements. The presence of glass side pieces 3 and 5 in the structure of this invention keeps the contact areas separated enough to keep the package capacitance low. This fact, plus the reduced size of the package results in a lower total package capacitance than attainable in prior art tunnel diode packages, for example those employing planar techniques as hereinabove mentioned. Since the junction afforded by the strip 17 across the slice 1 is small and adjacent the side 13, the cross-sectional area of the junction is substantially equal to the cross-sectional area of the strip. Since this results in a junction quite close in size to the desired final junction size, there is a lesser tendency to form the elongated small cross-section current path or "neck" through the N-type region adjacent the junction. Such a "neck" normally produces high series resistance values in tunnel diodes and reduces the mechanical strength of the structure, and its reduction is therefore advantageous. Thus, this structure reduces the package capacitance, inductance, and series resistance of the device and permits the utilization of high powers at high frequencies without the loss of mechanical strength or small size.

FIGURE 3 illustrates a block 47 composed of a slice of P-type germanium 49 sandwiched between two glass side pieces 51 and 53. A plurality of strips 55 of an alloy material are placed across the slice of germanium 49, in the same manner as the single strips 17 are placed across the germanium slices in FIGURES 1 and 2. Electrical contact areas 57 and 59 are formed at the ends of each of the strips of alloy material 55. If a single semi-distributed tunnel diode junction is desired, the contact areas 59 may be joined together to connect the junctions formed at strips 55 in parallel, as shown by the contact area 61. Also, the contact areas 57 may be joined as illustrated by section 63. On the other hand, if individual non-distributed junctions are desired, the block 47 may be cut up with a junction formed at a strip 55 contained in each of the separate units to form individual tunnel diodes.

The wafer illustrated in FIGURE 4 is the basic build-block for the devices discussed previously. A wafer of the P-type germanium 75 is sandwiched between glass wafers 77 and 79. The germanium is bonded to the glass wafers by the technique described in copending application Ser. No. 180,164, filed Mar. 16, 1962, now Patent No. 3,297,920, referred to above. After the germanium is bonded to the glass, the composite wafer 83 formed in this manner is then sliced along lines 85 in planes normal to the major faces of wafers 77 and 79. Slicing along lines 85 produces blocks 87 similar to blocks 47 depicted in FIGURE 3. The exposed germanium surfaces of blocks 87 may preferably lie in the <111> plane of the germanium.

After the blocks 87 have been sliced from the composite wafer 83, a side of the slice of germanium, such as side 13 of slice 47 in FIGURE 3, is polished to provide a smooth surface. A narrow strip of alloy material, such as 55 in FIGURE 3, is then placed across the uncovered germanium. This may be done by any method such as vapor deposition. The strips are then alloyed to the germanium to form tunnel diode junctions.

The junctions may then be electrically etched to provide the desired peak current. If additional physical protection is desired for the junctions, they may be potted. As discussed before, the junctions may be connected in parallel to provide a semi-distributed tunnel diode, or the block may be cut into individual tunnel diodes.

It should be realized that this description has been made with respect to one specific embodiment and that the invention is not limited to this embodiment or the particular uses described. It will be appreciated that modifications and changes may be made by those skilled in the art without departing from the spirit and scope of the invention. Therefore, it is not desired to limit this invention to the particular illustrations shown, but to cover all modifications and changes within the spirit and scope by the appended claims.

What we claim as new and desire to secure by Letters Patent of the United States is:

1. A tunnel diode comprising: a pair of side portions of glass, a slice of germanium of one conductivity type sandwiched between said glass side portions and having a first surface exposed between said glass side portions, a narrow strip of alloy material of opposite conductivity inducing type extending lengthwise across a portion of said first surface of said slice of germanium and alloyed therewith to form a tunnel diode junction of cross-sectional area substantially equal to the area of said narrow strip, said strip having a width, as measured perpendicular to its lengthwise dimension and parallel to said first surface, substantially less than the spacing of said glass side portions, an electrical contact carried by one of said glass portions and connected to said strip of material, and means for making a second electrical contact to a surface of said slice of germanium opposite said first surface.

2. A tunnel diode as recited in claim 1 wherein said slice of germanium is doped with a P-type impurity, and said alloy material includes an impurity of the N-type.

3. A tunnel diode having a semi-distributed junction comprising: a pair of glass side portions, a slice of germanium having an impurity characteristic of one type sandwiched between and having a first surface exposed between said glass portions, a plurality of spaced strips of an alloy material having an impurity characteristic of the opposite type from that in said slice of germanium, said strips of said alloy material extending lengthwise between said glass portions across said first surface of said slice of germanium and fused to said germanium to form therewith a plurality of spaced tunnel diode junctions, each said strip having a width, as measured perpendicular to its lengthwise dimension and parallel to said first surface, substantially less than the lengthwise dimension of said strip, an electrical contact area affixed to one of said glass portions and connected in parallel to one end of each of said strips to connect said junctions in parallel, and means for making an electrical contact to a surface of said slice of germanium opposite said first surface.

4. A tunnel diode comprising: a body of monocrystalline germanium of one conductivity type sandwiched between and bonded to a pair of side portions of glass, and said germanium body having a first surface exposed between and coplanar with an exposed surface of each of said side portions, a strip of an alloy material extending lengthwise across said first surface from one glass side portion to the other, said trip having a width, as measured perpendicular to the direction of spacing of said glass portions and parallel to said first surface, substantially less than the spacing of said glass portions, said alloy material being fused to said germanium and being of opposite conductivity inducing type forming a PN tunnel diode junction adjacent said first surface with a cross-sectional area substantially equal to the cross-sectional area of said opposite conductivity type, a first electrical contact provided on at least one of said glass side portions and connected to said strip, said germanuim body having a second surface facing substantially oppositely from said first surface, and a second electrical contact to said second surface of said germanium body.

References Cited

UNITED STATES PATENTS

| | | | |
|---|---|---|---|
| 3,235,428 | 2/1966 | Naymik | 317—235 |
| 3,248,614 | 4/1966 | Rutz | 317—234 |
| 3,258,660 | 6/1966 | Im | 317—234 |

JOHN W. HUCKERT, *Primary Examiner.*

JAMES D. KALLAM, *Examiner.*

J. D. CRAIG, *Assistant Examiner.*